US012690269B2

(12) United States Patent
Liu et al.

(10) Patent No.: US 12,690,269 B2
(45) Date of Patent: Jul. 21, 2026

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventors: Liwang Liu, Wuhan (CN); Wenqiang Yu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 375 days.

(21) Appl. No.: 18/412,941

(22) Filed: Jan. 15, 2024

(65) Prior Publication Data

US 2025/0159991 A1 May 15, 2025

Related U.S. Application Data

(63) Continuation of application No. PCT/CN2023/134913, filed on Nov. 29, 2023.

(30) Foreign Application Priority Data

Nov. 10, 2023 (CN) .......................... 202311513168.8

(51) Int. Cl.
*H10D 86/60* (2025.01)
*G02F 1/1362* (2006.01)
(Continued)

(52) U.S. Cl.
CPC ....... *H10D 86/60* (2025.01); *G02F 1/136286* (2013.01); *G02F 1/1368* (2013.01); *H10D 86/441* (2025.01)

(58) Field of Classification Search
CPC ........................... H10D 86/60; H10D 86/441; G02F 1/136286; G02F 1/1368
See application file for complete search history.

(56) References Cited

U.S. PATENT DOCUMENTS

| | | | | |
|---|---|---|---|---|
| 8,735,887 B2 * | 5/2014 | Murai | ................ | G01N 27/4141 |
| | | | | 257/253 |
| 10,068,933 B2 * | 9/2018 | Deng | ................ | G02F 1/133345 |

(Continued)

FOREIGN PATENT DOCUMENTS

| | | | | |
|---|---|---|---|---|
| CN | 101325201 B | * | 4/2011 | |
| CN | 104823270 A | * | 8/2015 | ............. G09G 3/344 |

(Continued)

OTHER PUBLICATIONS

Chinese Office Action issued in corresponding Chinese Patent Application No. 202311513168.8 dated Jan. 20, 2025, pp. 1-7.

*Primary Examiner* — Laura M Menz
(74) *Attorney, Agent, or Firm* — PV IP PC; Wei Te Chung

(57) ABSTRACT

A display panel has a display area, and in the display area the display panel includes multiple transparent active layers. Two first electrode conductor portions respectively in any two adjacent transparent active layers are electrically connected to a first transparent electrode and a second transparent electrode by via hole connections, respectively. The first transparent electrode and the second transparent electrode are disposed respectively in different layers insulated from each other.

20 Claims, 4 Drawing Sheets

(51) Int. Cl.
*G02F 1/1368* (2006.01)
*H10D 86/40* (2025.01)

(56) References Cited

U.S. PATENT DOCUMENTS

| | | | | |
|---|---|---|---|---|
| 10,417,977 B2 * | 9/2019 | Zhao | ............... | G09G 3/3607 |
| 10,504,946 B2 * | 12/2019 | Deng | ............... | G02F 1/133345 |
| 10,892,283 B2 * | 1/2021 | Zhang | ............... | H10D 86/441 |
| 11,093,064 B2 * | 8/2021 | Tanaka | ............... | G06F 3/0412 |
| 11,943,965 B2 * | 3/2024 | Lee | ............... | H10K 59/123 |
| 11,957,004 B2 * | 4/2024 | Zhou | ............... | H10K 71/00 |
| 12,379,633 B2 * | 8/2025 | Yu | ............... | H10D 86/443 |
| 2016/0148950 A1 * | 5/2016 | Xu | ............... | G02F 1/136209 |
| | | | | 438/158 |
| 2017/0162609 A1 * | 6/2017 | Kao | ............... | G02F 1/1368 |
| 2018/0047764 A1 * | 2/2018 | Deng | ............... | G02F 1/133345 |
| 2018/0330678 A1 * | 11/2018 | Zhao | ............... | G09G 3/3607 |
| 2018/0366498 A1 * | 12/2018 | Deng | ............... | G02F 1/133345 |
| 2019/0067399 A1 * | 2/2019 | Ishida | ............... | H10D 30/6729 |
| 2020/0251500 A1 * | 8/2020 | Zhang | ............... | H10D 86/441 |
| 2021/0111379 A1 * | 4/2021 | Lee | ............... | H10K 50/813 |
| 2022/0128849 A1 * | 4/2022 | Luo | ............... | H10D 86/021 |
| 2024/0004249 A1 * | 1/2024 | Yu | ............... | H10D 86/60 |
| 2024/0122035 A1 * | 4/2024 | Li | ............... | G02F 1/13439 |
| 2024/0251593 A1 * | 7/2024 | Lee | ............... | H10K 59/80515 |
| 2025/0159990 A1 * | 5/2025 | Liu | ............... | H10D 86/441 |
| 2025/0159991 A1 * | 5/2025 | Liu | ............... | G02F 1/136286 |
| 2025/0167095 A1 * | 5/2025 | Ruan | ............... | H10W 70/65 |

FOREIGN PATENT DOCUMENTS

| | | | | | | |
|---|---|---|---|---|---|---|
| CN | 105684135 A | * | 6/2016 | ............... | G09G 3/3688 |
| CN | 106356406 A | * | 1/2017 | ............... | C23C 18/1216 |
| CN | 105684135 B | * | 4/2019 | ............... | G09G 3/3677 |
| CN | 110047938 A | * | 7/2019 | ............... | G09G 3/3688 |
| CN | 110112186 A | * | 8/2019 | ............... | H10D 86/60 |
| CN | 110690229 A | * | 1/2020 | ............... | G02F 1/13439 |
| CN | 111668242 A | * | 9/2020 | ............... | H10D 86/481 |
| CN | 107024813 B | * | 10/2020 | ............... | G06F 3/04164 |
| CN | 110853509 B | * | 4/2021 | ............... | G09F 9/30 |
| CN | 113156651 A | * | 7/2021 | ............... | G02F 1/1343 |
| CN | 113671759 A | * | 11/2021 | ............... | G02F 1/134318 |
| CN | 114420703 A | * | 4/2022 | ............... | H10D 86/441 |
| CN | 114551542 A | * | 5/2022 | ............... | H10D 86/0231 |
| CN | 114649349 A | * | 6/2022 | ............... | G02F 1/1368 |
| CN | 114690493 A | * | 7/2022 | ............... | G02F 1/13629 |
| CN | 114913782 A | * | 8/2022 | ............... | G02F 1/153 |
| CN | 115032842 A | * | 9/2022 | ............... | G02F 1/1362 |
| CN | 115032842 B | * | 11/2023 | ............... | H10D 86/481 |
| CN | 117594608 A | * | 2/2024 | ............... | H10D 86/423 |
| CN | 117594609 A | * | 2/2024 | ............... | H10D 86/421 |
| CN | 114690493 B | * | 4/2024 | ............... | G02F 1/1362 |
| CN | 117594608 B | * | 5/2025 | ............... | H10D 86/423 |
| CN | 117594609 B | * | 5/2025 | ............... | H10D 86/421 |
| CN | 120187098 A | * | 6/2025 | ............... | G02F 1/13613 |
| CN | 114649349 B | * | 8/2025 | ............... | H10D 86/60 |
| CN | 120417483 A | * | 8/2025 | ............... | H10D 86/423 |
| CN | 120568843 A | * | 8/2025 | ............... | H10D 86/421 |
| CN | 120730836 A | * | 9/2025 | ............... | H10D 86/0221 |
| EP | 3557630 A1 | * | 10/2019 | ............... | G06F 3/044 |
| KR | 102481378 B1 | * | 12/2022 | ............... | G02F 1/13439 |
| KR | 102490881 B1 | * | 1/2023 | ............... | H10D 86/481 |
| KR | 102713791 B1 | * | 10/2024 | ............... | H10K 59/131 |
| WO | 2016078170 A1 | | 5/2016 | | |
| WO | WO-2017016009 A1 | * | 2/2017 | ............... | H10D 30/67 |
| WO | 2021072924 A1 | | 4/2021 | | |
| WO | WO-2025097511 A1 | * | 5/2025 | ............... | H10D 86/423 |
| WO | WO-2025123612 A1 | * | 6/2025 | ............... | G02F 1/13613 |

* cited by examiner

DISPLAY PANEL AND DISPLAY DEVICE

CROSS-REFERENCE TO RELATED APPLICATIONS

This application is a continuation application of International Application No. PCT/CN2023/134913, filed on Nov. 29, 2023, which claims priority to Chinese Application No. 202311513168.8, filed on Nov. 10, 2023. The disclosures of the above applications are incorporated herein by reference in their entireties.

FIELD

The present disclosure relates to display technologies, and more particularly, to a display panel and a display device.

BACKGROUND

With the development of display technology, consumer electronic products such as a mobile phone, a television, a personal digital assistant, a digital camera, a notebook computer, a desktop computer, a Virtual Reality (VR) display device, and an Augmented Reality (AR) display device, which rely on a display function of a display panel, are constantly emerging. Rise of a concept of "meta-universe" also causes a VR/AR display device to be widely concerned by consumers and has a broad market application prospect.

A VR/AR display device is a near-eye display device and has a high requirement for a resolution of a display panel therein. Generally, in a conventional pixel design architecture, the resolution of a display panel in a VR/AR display device can only reach 1000-1500 pixels per inch (PPI), and still cannot meet a user requirement. If the resolution is further improved, the relevant safety distance cannot be ensured due to limited space for layout, thereby reducing a product yield of display panels.

Therefore, there is a need to improve a product yield of display panels while ensuring high pixel resolution of each display panel.

SUMMARY

According to one or more embodiments of the present disclosure, a display panel has a display area, in the display area the display panel including: a substrate; a first metal layer disposed on a side of the substrate, the first metal layer comprising multiple data lines arranged at intervals in a first direction; a metal oxide semiconductor layer disposed between the substrate and the first metal layer, the metal oxide semiconductor layer comprising multiple transparent active layers arranged in an array, the transparent active layers respectively including multiple first electrode conductor portions, an orthographic projection of each of the first electrode conductor portions on the substrate being between respective orthographic projections of two adjacent ones of the data lines on the substrate; a first transparent conductive layer disposed on a side of the first metal layer away from the metal oxide semiconductor layer, the first transparent conductive layer including multiple first transparent conductive layer including multiple first transparent electrodes; and a second transparent conductive layer disposed on a side of the first transparent conductive layer away from the first metal layer and insulated from the first transparent conductive layer, the second transparent conductive layer comprising a plurality of second transparent electrodes. Two of the first electrode conductor portions respectively in any two adjacent ones of the transparent active layers in the first direction are electrically connected to one of the first transparent electrodes and one of the second transparent electrodes through via hole connections, respectively.

According to one or more embodiments of the present disclosure, a display device includes a housing and any one of above-mentioned display panels disposed in the housing, The display panel has a display area. In the display area the display panel includes multiple data lines arranged at intervals in the first direction, the display area is divided into multiple pixel columns by the multiple data lines, and each of the pixel columns includes multiple pixel regions in each of which one of the transparent active layers is disposed. The multiple pixel columns include multiple odd-numbered pixel columns and multiple even-numbered pixel columns. In each of the pixel regions of each of the odd-numbered pixel columns, one of the first electrode conductor portions is electrically connected to one of the first transparent electrodes; and in each of the pixel regions of each of the even-numbered pixel columns, one of the first electrode conductor portions is electrically connected to one of the second transparent electrodes.

DETAILED DESCRIPTION

Figure 1:
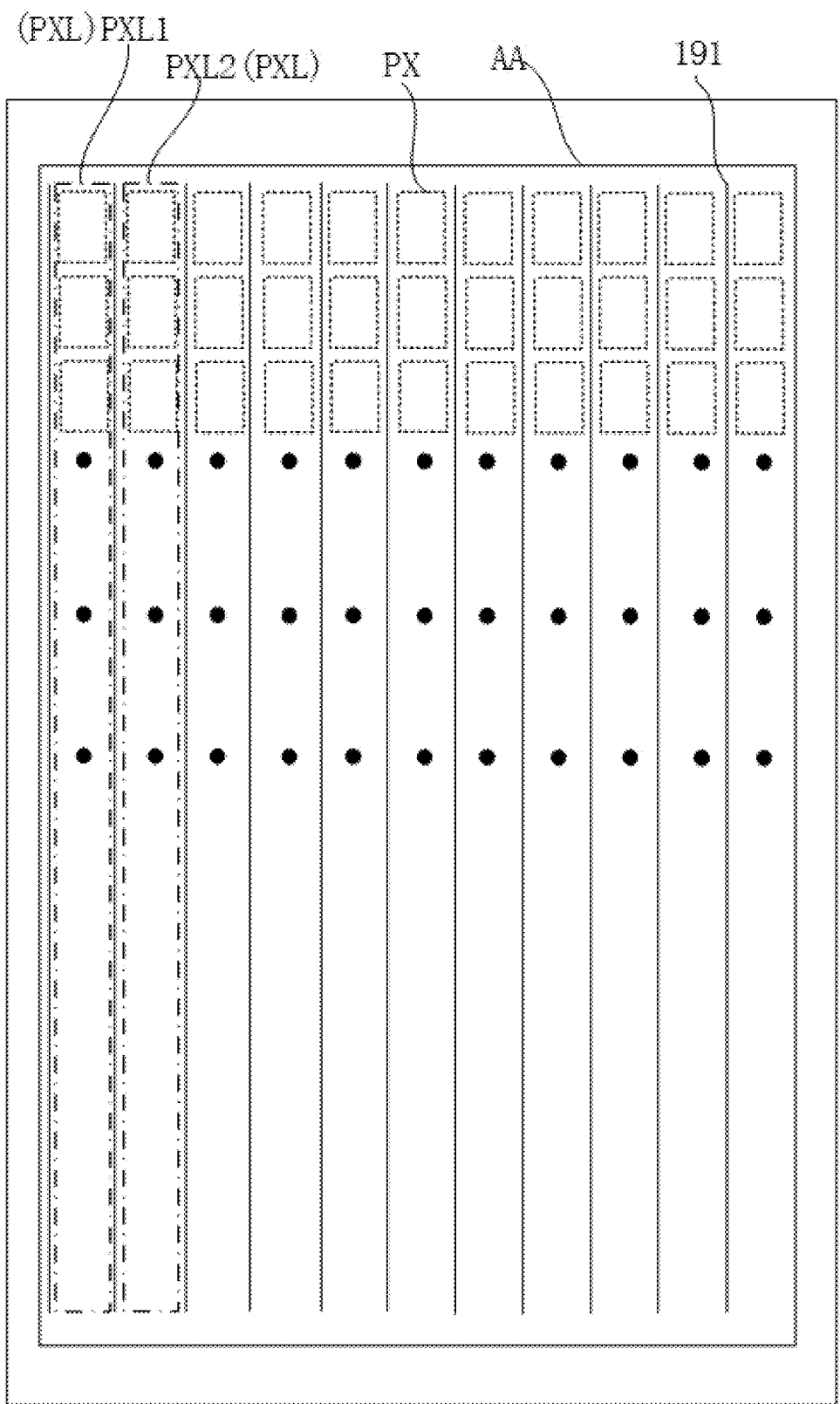
FIG. 1 is a schematic diagram of division of a display area of a display panel according to one or more embodiments of the present disclosure.

According to one or more embodiments of the present disclosure, a display panel has a display area, in the display area the display panel includes: a substrate; a first metal layer disposed on a side of the substrate, the first metal layer including multiple data lines arranged at intervals in a first direction; a metal oxide semiconductor layer disposed between the substrate and the first metal layer, the metal oxide semiconductor layer including multiple transparent active layers arranged in an array, the transparent active layers respectively including a plurality of first electrode conductor portions, an orthographic projection of each of the first electrode conductor portions on the substrate being between respective orthographic projections of two adjacent ones of the data lines on the substrate; a first transparent conductive layer disposed on a side of the first metal layer away from the metal oxide semiconductor layer, the first transparent conductive layer including multiple first transparent electrodes; and a second transparent conductive layer disposed on a side of the first transparent conductive layer away from the first metal layer and insulated from the first transparent conductive layer, the second transparent conductive layer including multiple second transparent electrodes. In the display area the display panel is provided with multiple first via holes and multiple second via holes, in two adjacent ones of the transparent active layers in the first direction, first electrode conductor portions respectively in the two transparent active layers are respectively electrically connected to one of the first transparent electrodes through one of the first via holes and electrically connected to one of the second transparent electrodes through one of the second via holes.

Optionally, the first transparent conductive layer and the second transparent conductive layer include a same material, a same shape, and a same thickness.

Optionally, in the display area the display panel further includes a pixel electrode layer including multiple first pixel electrodes and multiple second pixel electrodes. In the display area the display panel is provided with multiple third via holes and a plurality of fourth via holes, each of the first pixel electrodes is electrically connected to one of the first transparent electrodes through one of the third via holes, and each of the first transparent electrodes is electrically connected to one of the first electrode conductor portions through one of the first via holes. Each of the second pixel electrodes is electrically connected to one of the second transparent electrodes through one of the fourth via holes, and each of the second transparent electrodes is electrically connected to one of the first electrode conductor portions through one of the second via holes. In a direction perpendicular to the substrate, a sum of a depth of each of the first via holes and a depth of each of the third via holes is equal to a sum of a depth of each of the second via holes and a depth of each of the fourth via holes, and the pixel electrode layer, the first transparent conductive layer and the second transparent conductive layer each include a same material.

Optionally, in the display area the display panel further includes: a first insulating layer disposed on a side of the first metal layer away from the substrate, the first transparent conductive layer being disposed on a surface of a side of the first insulating layer away from the substrate; and a second insulating layer disposed between the first transparent conductive layer and the second transparent conductive layer. The first transparent conductive layer is insulated from the second transparent conductive layer by the second insulating layer, and the first insulating layer and the second insulating layer comprise a same material.

Optionally, a thickness of the second insulating layer is greater than a thickness of the first insulating layer.

Optionally, in one of the first transparent electrodes and one of the second transparent electrodes which are adjacent in the first direction, an orthographic projection of an edge of the one of the first transparent electrodes near the one of the second transparent electrodes on the substrate overlaps an orthographic projection of one of the data lines on the substrate, and an orthographic projection of an edge of the one of the second transparent electrodes near the one of the first transparent electrodes on the substrate overlaps the orthographic projection of the one of the data lines on the substrate.

Optionally, the orthographic projection of the edge of the one of the first transparent electrodes near the one of the second transparent electrodes on the substrate is adjacent to or overlaps with the edge of the one of the second transparent electrodes near the one of the first transparent electrodes.

Optionally, the display area comprises a plurality of pixel regions arranged in an array, in the display the display panel area includes multiple thin film transistors arranged in an array, each of the pixel regions corresponds to one of the thin film transistors; and the multiple thin film transistors comprise multiple first thin film transistors and a plurality of second thin film transistors which are alternately arranged in the first direction, each of the first thin film transistors includes one of the transparent active layers and one of the first transparent electrodes, and each of the second thin film transistors includes one of the transparent active layers and one of the second transparent electrodes.

Optionally, in the display area the display panel further includes: a first gate layer disposed on a side of the substrate, the metal oxide semiconductor layer being disposed on a side of the first gate layer away from the substrate, the first gate layer including multiple first gate lines arranged at intervals in a second direction; and a second gate layer disposed on a side of the metal oxide semiconductor layer away from the substrate, the first metal layer being disposed on a side of the second gate layer away from the substrate, the second gate layer including multiple second gate lines arranged at intervals in the second direction. The thin film transistors further respectively include multiple first gates, multiple second gates, and multiple second electrodes, each of the first gates is comprised in one of the first gate lines, each of the second gates is included in one of the second gate lines, and each of the second electrodes is included in one of the data lines.

According to one or more embodiments of the present disclosure, a display device includes a housing and any one of above-mentioned display panels, the housing having an accommodation space in which the display panel is disposed. The display panel has a display area. In the display area the display panel includes multiple data lines arranged at intervals in the first direction, the display area is divided into multiple pixel columns by the multiple data lines, and each of the pixel columns comprises multiple pixel regions. The multiple pixel columns includes multiple odd-numbered pixel columns and multiple even-numbered pixel columns, one of the first electrode conductor portions respectively in each of the pixel regions of each of the odd-numbered pixel columns is electrically connected to one of the first transparent electrodes, and one of the first electrode conductor portions respectively in each of the pixel regions of each of the even-numbered pixel columns is electrically connected to a second transparent electrode.

A display panel and a display device is provided according to one or more embodiments of the present disclosure. The display panel has a display area, in the display area the display panel includes: a substrate; a first metal layer disposed on a side of the substrate, the first metal layer including multiple data lines arranged at intervals in a first direction; a metal oxide semiconductor layer disposed between the substrate and the first metal layer, the metal oxide semiconductor layer including multiple transparent active layers arranged in an array, the transparent active layers respectively including a plurality of first electrode conductor portions, an orthographic projection of each of the first electrode conductor portions on the substrate being between respective orthographic projections of two adjacent ones of the data lines on the substrate; a first transparent conductive layer disposed on a side of the first metal layer away from the metal oxide semiconductor layer, the first transparent conductive layer including multiple first transparent electrodes; and a second transparent conductive layer disposed on a side of the first transparent conductive layer away from the first metal layer and insulated from the first transparent conductive layer, the second transparent conductive layer including multiple second transparent electrodes.

In the display area the display panel is provided with multiple first via holes and multiple second via holes, in two adjacent ones of the transparent active layers in the first direction, first electrode conductor portions respectively in the two transparent active layers are respectively electrically connected to one of the first transparent electrodes through one of the first via holes and electrically connected to one of the second transparent electrodes through one of the second via holes. The display panel and the display device according to one or more embodiments of the present disclosure can improve product yield while ensuring high resolution.

In the following, the technical solutions in one or more embodiments of the present disclosure will be clearly and completely described in connection with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by those skilled in the art without involving any inventive effort are within the scope of the present disclosure. Furthermore, it is to be understood that the specific embodiments described herein are for purposes of illustration and explanation only and are not intended to limit the present disclosure. In the present disclosure, if not stated to the contrary, the use of positional terms such as "up" and "down" usually refer to up and down in actual use or working state of a device, specifically in a surface direction in the accompanying drawing. While terms such as "in" and "out" are in respect to an outline of a device.

The following disclosure provides many different embodiments or examples for implementing the different structures of the present disclosure. In order to simplify the disclosure of the present disclosure, components and arrangements of specific examples are described below. Of course, they are merely examples and are not intended to limit the present disclosure. In addition, the present disclosure may repeat reference numerals and/or reference letters in various examples, such repetition being for the purpose of simplicity and clarity, without itself indicating a relationship between the various embodiments and/or arrangements discussed. In addition, the present disclosure provides examples of various specific processes and materials, but those skilled in the art will recognize the application of other processes and/or the use of other materials. The following are detailed descriptions. In the following detailed description, it is to be noted that the order in which the following embodiments are described is not intended to limit the preferred order of the embodiments.

Figure 2:
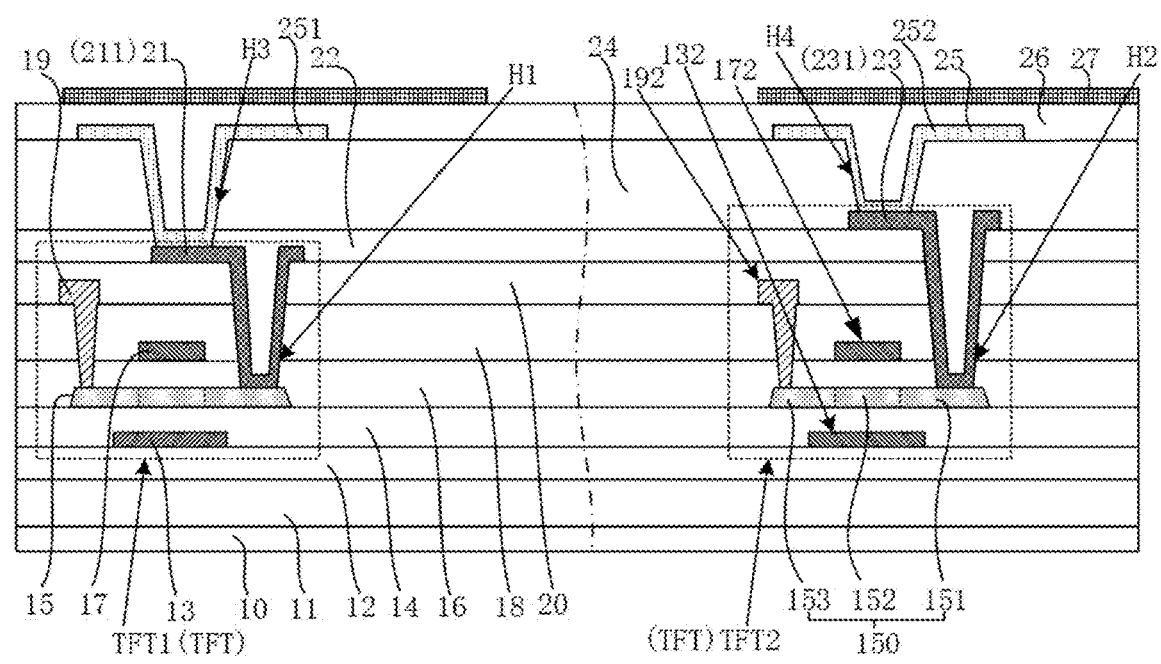
FIG. 2 is a schematic cross-sectional view of a display panel in a display area according to one or more embodiments of the present disclosure.
Figure 3:
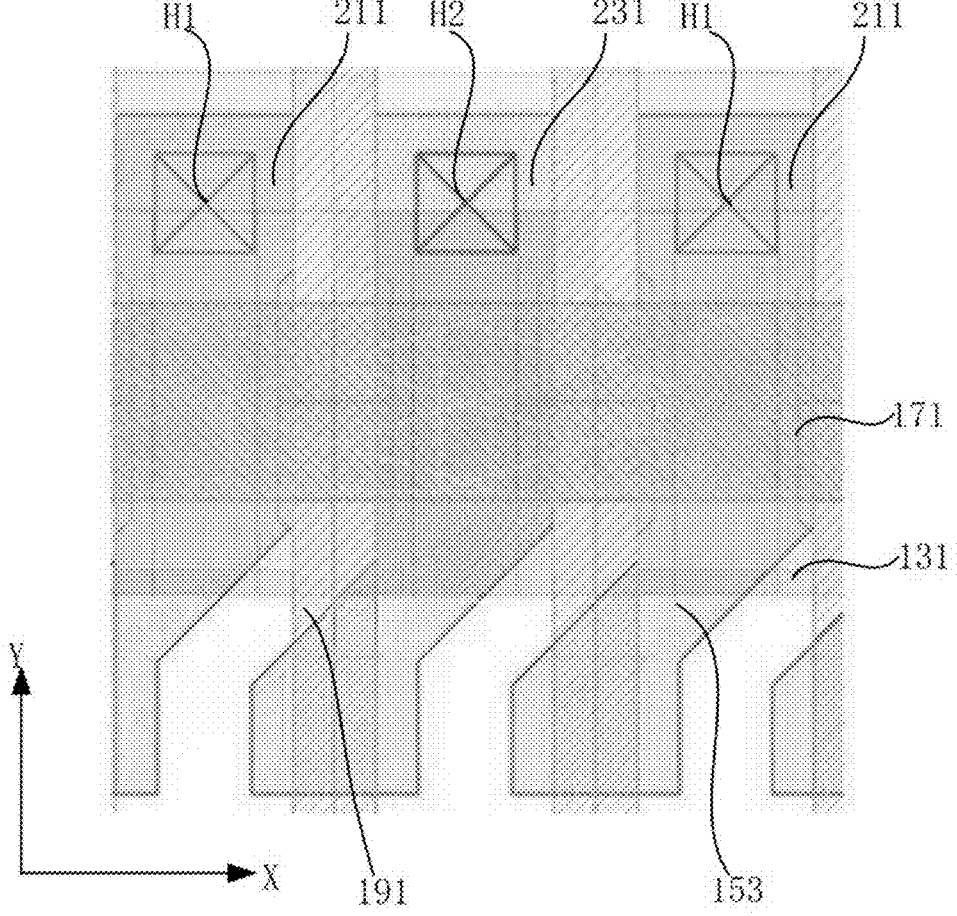
FIG. 3 is a schematic plan view of multiple layers of a display panel in a display area according to one or more embodiments of the present disclosure.
Figure 4:
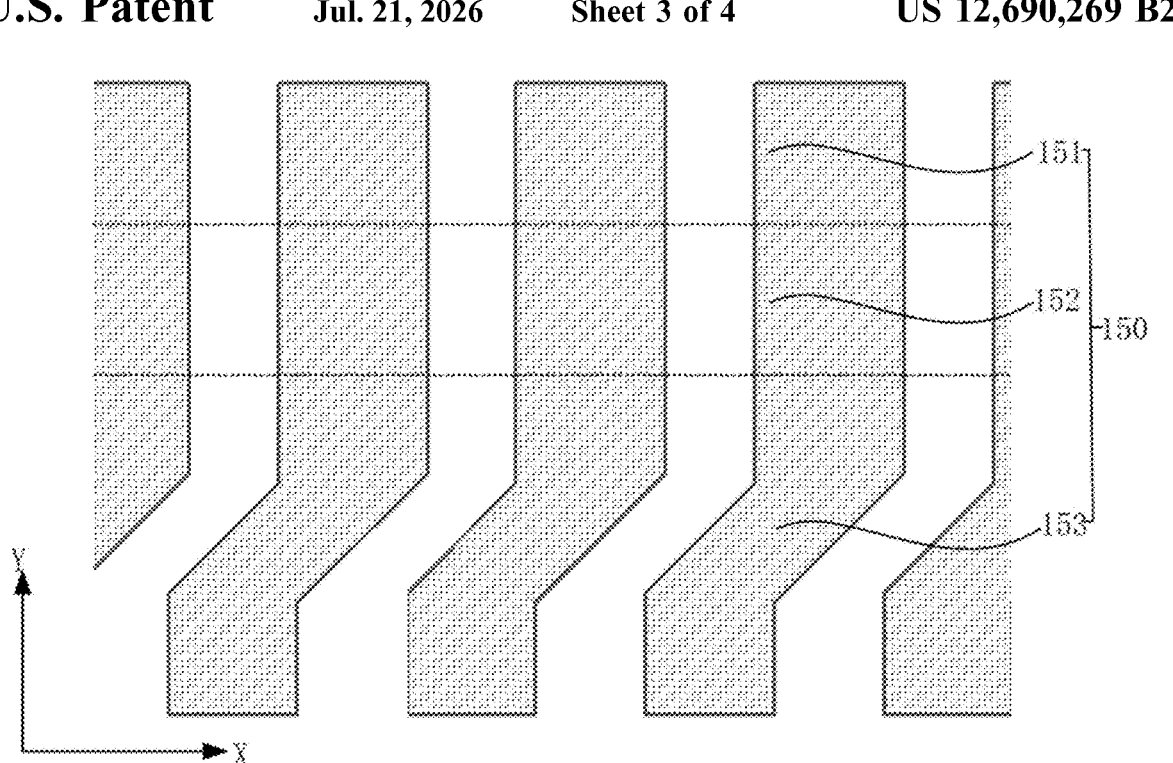
FIG. 4 is a schematic plan view of an active layer in a display area according to one or more embodiments of the present disclosure.
Figure 5:
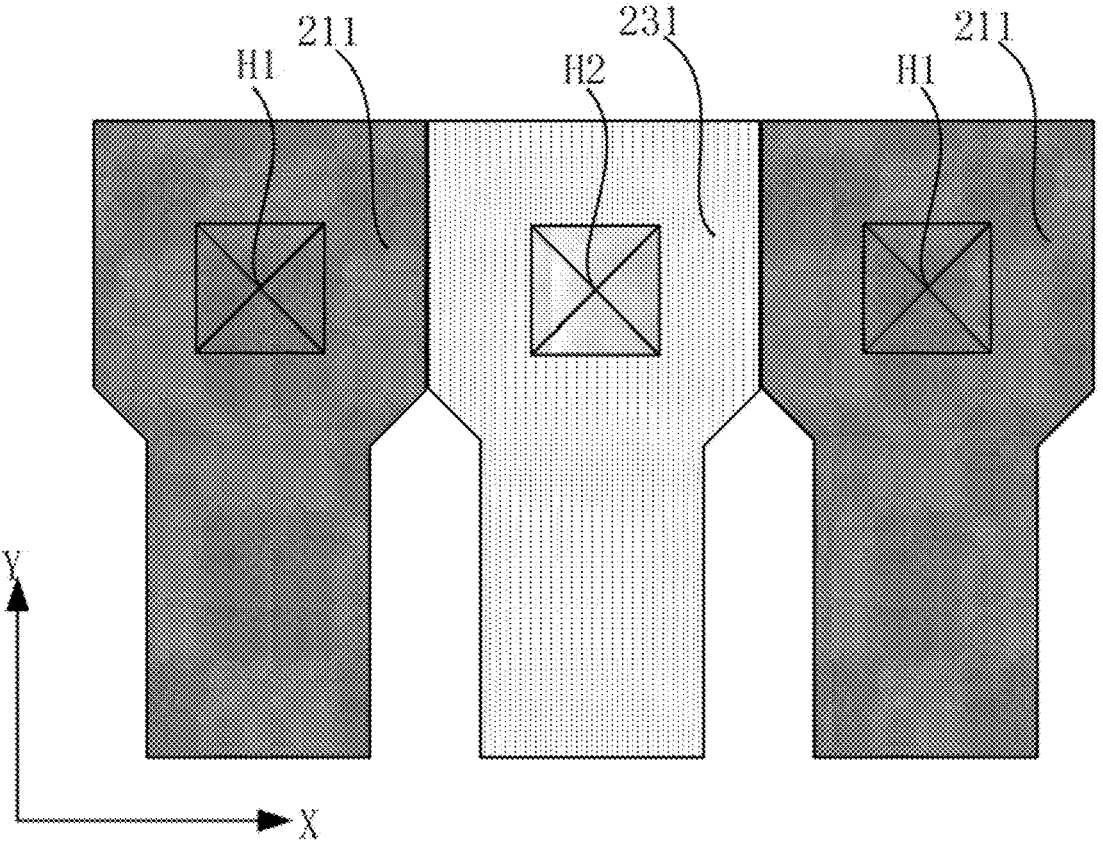
FIG. 5 is a schematic plan view of a first transparent conductive layer and a second transparent conductive layer according to one or more embodiments of the present disclosure.
Figure 6:
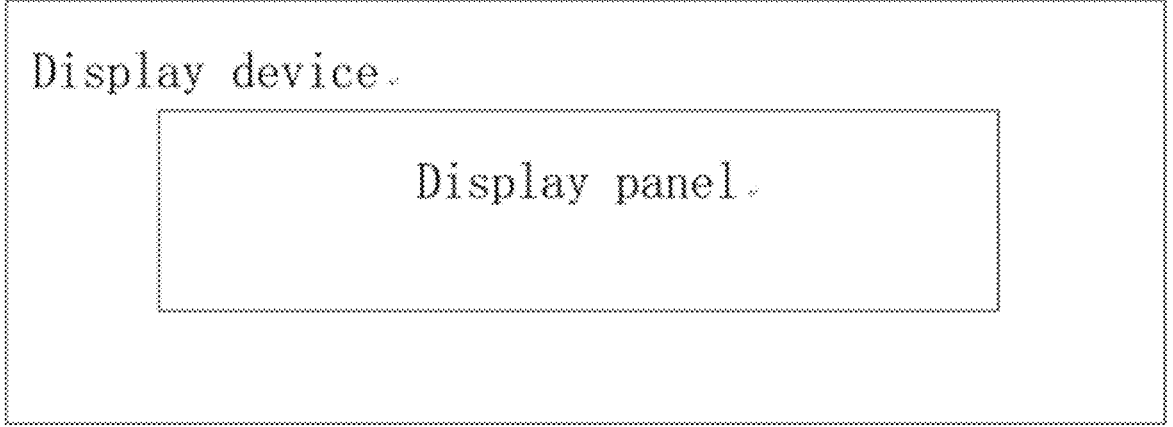
FIG. 6 is a block diagram of a display device according to one or more embodiments of the present disclosure.

As shown in FIGS. 1 to 5, in a first aspect, a display panel according to one or more embodiments of the present disclosure may be applied to a VR/AR-type display device that needs to have a high resolution, and may be a liquid crystal display panel.

Specifically, the display panel has a display area AA. In the display area AA the display panel includes: a substrate 10; a first metal layer 19 disposed on a side of the substrate 10, the first metal layer 19 including multiple data lines 191 arranged at intervals in sequence in a first direction X; a metal oxide semiconductor layer 15 disposed between the substrate 10 and the first metal layer 19, the metal oxide semiconductor layer 15 including multiple transparent active layers 150 arranged in an array, each of the transparent active layers 150 including a first electrode conductor portion 151, an orthographic projection of the first electrode conductor portion 151 on the substrate 10 being between two adjacent data lines 191; a first transparent conductive layer 21 disposed on a side of the first metal layer 19 away from the metal oxide semiconductor layer 15, the first transparent conductive layer 21 including multiple first transparent electrodes 211; a second transparent conductive layer 23 disposed on a side of the first transparent conductive layer 21 away from the first metal layer 19, the second transparent conductive layer 23 including multiple second transparent electrodes 231. In every two adjacent ones of the transparent active layers 150 in a first direction X, the first electrode conductor portion 151 in one of the two adjacent transparent active layers 150 is electrically connected to one of the first transparent electrodes 211 through a via hole, and the first electrode conductor portion 151 in another of the two adjacent transparent active layers 150 is electrically connected to one of the second transparent electrodes 231 through a via hole.

In the display panel according to the present disclosure, the display area AA is an area in which the display panel performs a display function. The display area AA includes multiple pixel columns PXL arranged at intervals in sequence in a row direction (that is, the first direction X). Each pixel column PXL includes multiple pixel regions PX, and the pixel regions PX are actual light transmission regions within the display area AA. Therefore, the number and distribution density of the pixel regions PX in the display area AA are directly related to the opening rate and the resolution of the display panel. The greater the number of the pixel columns PXL, the greater the number and distribution density of the pixel regions PX, and the greater the resolution of the display panel. Since the VR/AR-type liquid crystal display panel has a high requirement for resolution, accordingly, it is necessary to increase the number of pixel columns PXL as much as possible, and the pixel column PXL is opposite to a region between the two adjacent data lines 191.

In this case, when the number of pixel columns PXL is increased and the resolution of the display panel is increased, it is necessary to ensure the opening rate of the display panel in order to ensure the display effect of the pixel panel. In the display panel according to the present disclosure, since the metal oxide semiconductor layer 15 has light transmittance, the transparent active layer 150 may be formed by using the metal oxide semiconductor layer 15 having light transmittance, and the first electrode conductor portion 151 in the transparent active layer 150 is disposed between the two adjacent data lines 191, so that a region in which the first electrode conductor portion 151 is disposed can be used as the pixel region PX in the display panel, thereby improving the space utilization rate and the opening rate in the display area AA, further increasing the number of pixel regions PX that can be disposed in the limited display area AA, and improving the resolution of the display panel. Illustratively, the display panel is a liquid crystal display panel. When the first electrode conductor portion 151 is disposed between the two adjacent data lines 191, since the first electrode conductor portion 151 has light transmittance, the first electrode conductor portion 151 does not block the exit light of the backlight source in the liquid crystal display panel, so that an area in which the first electrode conductor portion 151 is disposed has a precondition to be used as the pixel region PX.

The transparent active layer 150 is a part of a metal oxide thin film transistor in the display area AA. As a driving element of the display panel, the metal oxide thin film transistor needs to supply a driving signal to a pixel electrode in the pixel region PX. In order to ensure normal transmission of the driving signal, the metal oxide thin film transistor also needs to include a transparent electrode (functionally as a source or a drain) electrically connected to the first electrode conductor portion 151 and the pixel electrode, and the transparent electrode as an interconnecting structure needs to be electrically connected to the first electrode conductor portion 151 by a via hole connection. Therefore, it is inevitable that the first electrode conductor portion 151 and the first electrode overlap in a direction perpendicular to the substrate 10 so as to facilitate the arrangement of a via hole. As described above, a region in which the first electrode conductor portion 151 is located has a need as the pixel region PX. Therefore, in order to ensure light transmittance of the region in which the first electrode conductor portion 151 is located, the transparent electrode is formed by using a transparent conductive layer having light transmittance.

However, it is found that since the transparent electrode is electrically connected to the first electrode conductor portion 151 by a via hole connection, in order to ensure stability of the via hole connection, it is necessary to ensure a coverage rate of the transparent electrode to the via hole. So that a maximum width of the transparent electrode opposite to the via hole and the region in which the first electrode conductor portion 151 is disposed in the first direction X (that is, an arrangement direction of the data lines 191) should be greater than a maximum width of the via hole in the first direction X, thereby making the maximum width of the first electrode opposite to the via hole and the region in which the first electrode conductor portion 151 is located in the first direction X greater. Generally, since the transparent electrodes are arranged in a same layer and are arranged repeatedly in sequence in the first direction X, such a configuration may result in a small distance between every two adjacent transparent electrodes in the first direction X, which may easily cause safety problems, thereby greatly reducing stability and yield of display panels.

In the display panel according to one or more embodiments of the present disclosure, by forming two transparent electrode which are insulated from each other, the conventional transparent electrode is redivided into a first transparent electrode 211 disposed in a first transparent conductive layer 21 and a second transparent electrode 231 disposed in a second transparent conductive layer 23, so that in a case that the first transparent electrode 211 and the second transparent electrode 231 which are adjacent in the first direction X are spaced by a small distance, security between the first transparent electrode 211 and the second transparent electrode 231 can still be ensured, thereby improving the stability and yield of display panels.

Specifically, in two transparent active layers 150 which are adjacent in the first direction X, a first electrode conductor portion 151 in one of the transparent active layers 150 is electrically connected to the first transparent electrode 211 through a via hole, and a first electrode conductor portion 151 in another of the transparent active layers 150 is electrically connected to the second transparent electrode 231 through a via hole. Although, in order to ensure the stability of the via hole connection, a width of part of the first transparent electrode 211 opposite to the first electrode conductor portion 151 in the first direction X is large, and a width of part of the second transparent electrode 231 opposite to the second electrode conductor portion 153 in the first direction X is large, the first transparent electrode 211 and the second transparent electrode 231 are spaced by a small distance in the first direction X. Since the first transparent conductive layer 21 in which the first transparent electrode 211 is located and the second transparent conductive layer

23 in which the second transparent electrode 231 is located are disposed in different layers and electrically insulated, the security between the first transparent electrode 211 and the second transparent electrode 231 can be ensured, and the stability and yield of the display panels can be improved.

In one or more embodiments of the present disclosure, both the first transparent conductive layer 21 and the second transparent conductive layer 23 have a same material, a same shape, and a same thickness.

In the display panel according to the present disclosure, the second transparent conductive layer 23 is a key layer for improving the product yield of the display panels while ensuring a high pixel resolution. However, the second transparent conductive layer 23 is a new-added layer, which inevitably causes an increase in processing steps and an increase in cost. According to one or more embodiments of the present disclosure, by configuring the first transparent conductive layer 21 and the second transparent conductive layer 23 to have a same material, the second transparent conductive layer 23 can be formed by using an existing layer forming device for forming the first transparent conductive layer 21, thereby reducing the production cost as much as possible. Also, shapes of the first transparent conductive layer 21 and the second transparent conductive layer 23 refers to shapes of orthographic projections of the first transparent conductive layer 21 and the second transparent conductive layer 23 on the substrate 10, respectively, which correspond to a shape of a mask plate. According to one or more embodiments of the present disclosure, by configuring the shapes of the first transparent conductive layer 21 and the second transparent conductive layer 23 to be same, the second transparent conductive layer 23 can be formed by using an existing mask plate for forming the first transparent conductive layer 21, so that there is no need to form a mask plate separately for the second transparent electrode 231, thereby reducing the manufacturing cost as much as possible. Also, the thicknesses of the first transparent conductive layer 21 and the second transparent conductive layer 23 refer to thicknesses of the first transparent conductive layer 21 and the second transparent conductive layer 23 in a direction perpendicular to the substrate 10, respectively, which correspond to layer forming time. According to one or more embodiments of the present disclosure, by configuring the thicknesses of the first transparent conductive layer 21 and the second transparent conductive layer 23 to be same, the second transparent conductive layer 23 can be formed by using existing layer forming parameters for forming the first transparent conductive layer 21, so that there is no need to configure layer forming parameters separately for the second transparent electrode 231, thus improving a process efficiency.

In one or more embodiments of the present disclosure, the display panel further includes a pixel electrode layer 25 including multiple first pixel electrodes 251 and multiple second pixel electrodes 252. Each of the first pixel electrodes 251 is electrically connected to one of the first transparent electrodes 211 through a third via hole H3, and each of the first transparent electrodes 211 is electrically connected to one of the first electrode conductor portions 151 through a first via hole H1. Each of the second pixel electrodes 252 is electrically connected to one of the second transparent electrodes 231 through a fourth via hole H4, and each of the second transparent electrodes 231 is electrically connected to one of the first electrode conductor portion 151 through a second via hole H2. In the direction perpendicular to the substrate 10, a sum of depths of the first via hole H1 and the third via hole H3 is equal to a sum of depths of the second via hole H2 and the fourth via hole H4, and both the pixel electrode layer 25 and each of the first transparent conductive layer 21 and the second transparent conductive layer 23 have a same material.

In the display panel according to one or more embodiments of the present disclosure, the first transparent electrode 211 is electrically connected to the first pixel electrode 251 by a via hole connection, the second transparent electrode 231 is electrically connected to the second pixel electrode 252 by a via hole connection, and both the first pixel electrode 251 and the second pixel electrode 252 belong to the pixel electrode layer 25 (that is, the first pixel electrode 251 and the second pixel electrode 252 are according to a same layer). Thus, in the direction perpendicular to the substrate 10, it enables the sum of the depths of the first via hole H1 and the third via hole H3 to be equal to the sum of the depths of the second via hole H2 and the fourth via hole H4, so that a driving signal of the first pixel electrode 251 and a driving signal of the second pixel electrode 252 are consistent in transmission distance in the direction perpendicular to the substrate 10, thereby improving signal transmission consistency of the driving signal of the first pixel electrode 251 and the driving signal of the second pixel electrode 252, and improving display effect of the display panel. Also, since both the pixel electrode layer 25 and each of the first transparent conductive layer 21 and the second transparent conductive layer 23 have a same material, a resistance the driving signal of the first pixel electrode 251 in a process of being transmitted from the first electrode conductor portion 151 to the first pixel electrode 251 is equal to a resistance of the driving signal of the second pixel electrode 252 in a process of being transmitted from the first electrode conductor portion 151 to the second pixel electrode 252, thereby further improving the signal transmission consistency of the driving signal of the first pixel electrode 251 and the driving signal of the second pixel electrode 252, and further improving the display effect of the display panel.

In one or more embodiments of the present disclosure, the display panel further includes a first insulating layer 20 disposed on a side of the first metal layer 19 away from the substrate 10, the first transparent conductive layer 21 being disposed on a surface of the first insulating layer 20 away from the substrate 10; and a second insulating layer 22 disposed between the first transparent conductive layer 21 and the second transparent conductive layer 23. The first transparent conductive layer 21 is insulated from the second transparent conductive layer 23 by the second insulating layer 22, and both the first insulating layer 20 and the second insulating layer 22 have a same material.

In the display panel according to one or more embodiments of the present disclosure, the first transparent conductive layer 21 is insulated from the second transparent conductive layer 23 by the second insulating layer 22, that is, the second insulating layer 22 is a necessary new-added layer capable of electrically insulating the first transparent conductive layer 21 and the second transparent conductive layer 23. Accordingly, the second insulating layer 22 causes an increase in layers of the display panel and an increase in the cost. The first insulating layer 20 is a bearing layer of the first transparent conductive layer 21. According to one or more embodiments of the present disclosure, by configuring the first insulating layer 20 and the second insulating layer 22 to have a same material, the second insulating layer 22 can be formed by using an existing layer forming device for forming the first insulating layer 20, thereby reducing the production cost as much as possible.

In one or more embodiments of the present disclosure, the thickness of the second insulating layer 22 is greater than the thickness of the first insulating layer 20.

In the display panel according to one or more embodiments of the present disclosure, the second insulating layer 22 is a necessary layer capable of electrically insulating the first transparent conductive layer 21 and the second transparent conductive layer 23. An insulating property of the second insulating layer 22 directly affects an effect of insulating the first transparent electrode 211 and the second transparent electrode 231, thereby affecting the stability and safety of the display panel. According to one or more embodiments of the present disclosure, by configuring the thickness of the second insulating layer 22 to be greater than the thickness of the first insulating layer 20, the effect of insulating the first transparent electrode 211 and the second transparent electrode 231 can be further improved, thereby improving the stability and safety of the display panel, and providing a structural basis for the first transparent electrode 211 to completely cover the first via hole H1 and the second transparent electrode 231 to completely cover the second via hole H2.

In one or more embodiments of the present disclosure, in the first transparent electrode 211 and the second transparent electrode 231 which are adjacent in the first direction X, an orthographic projection of an edge of the first transparent electrode 211 near the second transparent electrode 231 on the substrate 10 overlaps with an orthographic projection of the data line 191 on the substrate 10, and an orthographic projection of an edge of the second transparent electrode 231 near the first transparent electrode 211 on the substrate 10 overlaps with the front projection of the data line 191 on the substrate 10.

In the display panel according to one or embodiments of the present disclosure, in the first transparent electrode 211 and the second transparent electrode 231 which are adjacent in the first direction X, an orthographic projection of an edge of the first transparent electrode 211 near the second transparent electrode 231 on the substrate 10 overlaps with an orthographic projection of the data line 191 on the substrate 10, and an orthographic projection of an edge of the second transparent electrode 231 near the first transparent electrode 211 on the substrate 10 overlaps with the front projection of the data line 191 on the substrate 10. So that maximum widths of the first transparent electrode 211 and the second transparent electrode 231 in the first direction X is further increased, the coverage of the first via hole H1 by the first transparent electrode 211 is improved, the coverage of the second via hole H2 by the second transparent electrode 231 is improved, and connective stability of the first transparent electrode 211, the second transparent electrode 231, and the first electrode conductor portion 151 is improved.

In one or more embodiments of the present disclosure, in the first transparent electrode 211 and the second transparent electrode 231 which are adjacent in the first direction X, an orthographic projection of an edge of the first transparent electrode 211 near the second transparent electrode 231 on the substrate 10 is adjacent to or overlaps with an edge of the second transparent electrode 231 near the first transparent electrode 211.

In the display panel according to one or more embodiments of the present disclosure, in the first transparent electrode 211 and the second transparent electrode 231 which are adjacent in the first direction X, an orthographic projection of an edge of the first transparent electrode 211 near the second transparent electrode 231 on the substrate 10 is adjacent to or overlaps with an edge of the second transparent electrode 231 near the first transparent electrode 211. That is, the first transparent electrode 211 and the second transparent electrode 231 are not limited by the boundaries of their respective edges, so that the maximum width of the first transparent electrode 211 and the second transparent electrode 231 in the first direction X can be further increased, the coverage of the first via hole H1 by the first transparent electrode 211 is further improved, the coverage of the second via hole H2 by the second transparent electrode 231 is improved, and the connective stability of the first transparent electrode 211, the second transparent electrode 231 and the first electrode conductor portion 151 is further improved.

In one or more embodiments of the present disclosure, the display area AA includes multiple pixel regions PX arranged in an array, in the display area AA the display panel includes multiple thin film transistor TFTs arranged in an array, and each of the pixel regions PX is opposite to one of the thin film transistor TFTs. The thin film transistor TFTs includes multiple first thin film transistors TFT1 and multiple second thin film transistors TFT2, the first thin film transistors TFT1 and the second thin film transistors TFT2 are alternately arranged in the first direction X, each of the first thin film transistors TFT1 includes one of the transparent active layers 150 and one of the first transparent electrodes 211, and each of the second thin film transistors TFT2 includes one of the transparent active layers 150 and one of the second transparent electrodes 231.

The display panel according to one or more embodiments of the present disclosure may be applied to a VR/AR-type display device. Therefore, a high opening rate is required. According to one or more embodiments of the present disclosure, each pixel region PX corresponds to one of the thin film transistors TFTs. That is, the pixel electrode in each of the pixel regions PX is driven by only one of the thin film transistors TFTs, so as to reduce the number of the thin film transistors TFTs as much as possible and increase the opening rate of the display panel. Further, the first transparent electrode 211 is located in the first transparent conductive layer 21, and the second transparent electrode 231 is located in the second transparent conductive layer 23. Therefore, in the first thin film transistor TFT1 and the second thin film transistor TFT2 which are adjacent in the first direction X, safety due to an excessively small spacing distance in the first direction X between the adjacent first transparent electrode 211 and the second transparent electrode 231 is improved, thereby improving the stability of the first thin film transistor TFT1 and the second thin film transistor TFT2, further improving the safety of the display panel.

In one or more embodiments of the present disclosure, in the display area AA the display panel further includes a first gate layer 13 disposed on a side of the substrate 10, the metal oxide semiconductor layer 15 being disposed on a side of the first gate layer 13 away from the substrate 10, the first gate layer 13 including multiple first gate lines 131 arranged at intervals in sequence in a second direction Y; and a second gate layer 17 disposed on a side of the metal oxide semiconductor layer 15 away from the substrate 10, the first metal layer 19 being disposed on a side of the second gate layer 17 away from the substrate 10, the second gate layer 17 including multiple second gate lines 171 arranged at intervals in sequence in the second direction Y. The thin film transistor TFT further includes a first gate 132, a second gate 172, and a second electrode 192, the first gate line 131 includes the first gate 132, the second gate line 171 includes the second gate 172, and the data line 191 includes the second electrode 192.

In the display panel according to one or more embodiments of the present disclosure, the transparent active layer 150 of the thin film transistor TFT is located in the metal oxide semiconductor layer 15, that is, a type of the thin film transistor TFT is a metal oxide thin film transistor. Therefore, the thin film transistor TFT has a problem of low mobility. According to one or more embodiments of the present disclosure, by forming the thin film transistor TFT into a dual-gate structure including a first gate 132 and a second gate 172, the performance of the thin film transistor TFT can be effectively improved. In addition, the first gate line 131 includes the first gate electrode 132, the second gate line 171 includes the second gate electrode 172, and the data line 191 includes the second electrode 192. Therefore, the first gate electrode 132, the second gate electrode 172, and the second electrode 192 belong to part of the first gate line 131, the second gate line 171, and the data line 191, respectively, thereby preventing a problem of affecting the opening rate of the display panel caused by opacity of the first gate electrode 132, the second gate electrode 172, and the second electrode 192.

In one or more embodiments of the present disclosure, the first transparent electrode 211 in the first thin film transistor TFT1 is one of a source and a drain, and the second electrode 192 in the first thin film transistor TFT1 is another of the source and the drain. The second transparent electrode 231 in the second thin film transistor TFT2 is one of a source and a drain, and the second electrode 192 in the second thin film transistor TFT2 is another of the source and the drain.

In one or more embodiments of the present disclosure, the transparent active layer 150 further includes a channel 152 and a second electrode conductor portion 153. The first electrode conductor portion 151 and the second electrode conductor portion 153 are disposed on opposite sides of the channel 152, respectively, and the second electrode conductor portion 153 is electrically connected to the second electrode through a via hole connection.

In one or more embodiments of the present disclosure, the display panel further includes a functional layer 11, a first gate insulating layer 12, a second gate insulating layer 14, a third gate insulating layer 16, an interlayer dielectric layer 18, a flat layer 24, a passivation layer 26, and a common electrode layer 27. The functional layer 11 is disposed on a side of the substrate 10, the first gate insulating layer 12 is disposed on a side of the functional layer 11 away from the substrate 10, the first gate layer 13 is disposed on a side of the first gate insulating layer 12 away from the substrate 10, the second gate insulating layer 14 is disposed on a side of the first gate layer 13 away from the substrate 10, the metal oxide semiconductor layer 15 is disposed on a side of the second gate insulating layer 14 away from the substrate 10, the third gate insulating layer 16 is disposed on a side of the metal oxide semiconductor layer 15 away from the substrate 10, the second gate layer 17 is disposed on a side of the third gate insulating layer 16 away from the substrate 10, the interlayer dielectric layer 18 is disposed on a side of the second gate layer 17 away from the substrate 10, the first metal layer 19 is disposed on a side of the interlayer dielectric layer 18 away from the substrate 10, the first insulating layer 20 is disposed on a side of the first metal layer 19 away from the substrate 10, the first transparent conductive layer 21 is disposed on a side of the first insulating layer 20 away from the substrate 10, the second insulating layer 22 is disposed on a side of the first transparent conductive layer 21 away from the substrate 10, the second transparent conductive layer 23 is disposed on a side of the second insulating layer 22 away from the substrate 10, the flat layer 24 is disposed on a side of the second transparent conductive layer 23 away from the substrate 10, the pixel electrode layer 25 is disposed on a side of the flat layer 24 away from the substrate 10, the passivation layer 26 is disposed on a side of the pixel electrode layer 25 away from the substrate 10, and the common electrode layer 27 is disposed on a side of the passivation layer 26 away from the substrate 10. The first via hole H1 passes through the first insulating layer 20, the interlayer dielectric layer 18 and the third gate insulating layer 16, the second via hole H2 passes through the second insulating layer 22, the first insulating layer 20, the interlayer dielectric layer 18 and the third gate insulating layer 16, the third via hole H3 passes through the flat layer 24 and the second insulating layer 22, and the fourth via hole H4 passes through the flat layer 24.

According to one or more embodiments of the present disclosure, a display device including a housing and a display panel. The housing has an accommodating space in which the display panel is disposed. The display panel has a display area AA, and in the display area AA the display panel includes multiple data lines 191 arranged at intervals in sequence in a first direction X. The display area AA is divided into multiple pixel columns PXL by the multiple data lines 191, and each of the pixel columns PXL includes multiple pixel regions PX. The multiple pixel columns PXL includes multiple odd-numbered pixel columns PXL1 and multiple even-numbered pixel columns PXL2, a first electrode conductor portion 151 in each of the pixel regions PX of the odd-numbered pixel columns PXL1 is electrically connected to a first transparent electrode 211, and a first electrode conductor portion 151 in each of the pixel regions PX of each of the even-numbered pixel columns PXL2 is electrically connected to a second transparent electrode 231.

In the display device according to one or more embodiment of the present disclosure, a first transparent electrode 211 is disposed in each of the pixel regions PX of each of the odd-numbered pixel columns PXL1, that is, in each of the pixel regions PX of each of the odd-numbered pixel columns PXL1, a transparent electrode electrically connected to the first electrode conductor portion 151 through a via hole is disposed in the first transparent conductive layer 21. A second transparent electrode 231 is disposed in each of the pixel regions PX of each of the even-numbered pixel columns PXL2, that is, in each of the pixel regions PX of each of the even-numbered pixel column PXL2, a transparent electrode electrically connected to the first electrode conductor portion 151 through the via hole is disposed in a second transparent conductive layer 23 that is insulated from the first transparent conductive layer 21. So that the product yield due to an excessively small spacing distance in the first direction X between two adjacent transparent electrodes respectively in the odd-numbered pixel column PXL1 and the even-numbered pixel column PXL2 which are adjacent is improved, thereby improving the resolution of the display panel in the display device while maintaining high safety.

In summary, a display panel and a display device is provided according to one or more embodiments of the present disclosure. The display panel has a display area, in the display area the display panel includes: a substrate; a first metal layer disposed on a side of the substrate, the first metal layer including multiple data lines arranged at intervals in a first direction; a metal oxide semiconductor layer disposed between the substrate and the first metal layer, the metal oxide semiconductor layer including multiple transparent active layers arranged in an array, the transparent active layers respectively including a plurality of first electrode conductor portions, an orthographic projection of each of the first electrode conductor portions on the substrate being between respective orthographic projections of two adjacent ones of the data lines on the substrate; a first transparent conductive layer disposed on a side of the first metal layer away from the metal oxide semiconductor layer, the first transparent conductive layer including multiple first transparent electrodes; and a second transparent conductive layer disposed on a side of the first transparent conductive layer away from the first metal layer and insulated from the first transparent conductive layer, the second transparent conductive layer including multiple second transparent electrodes. In the display area the display panel is provided with multiple first via holes and multiple second via holes, in two adjacent ones of the transparent active layers in the first direction, first electrode conductor portions respectively in the two transparent active layers are respectively electrically connected to one of the first transparent electrodes through one of the first via holes and electrically connected to one of the second transparent electrodes through one of the second via holes. The display panel and the display device according to one or more embodiments of the present disclosure can improve product yield while ensuring high resolution.

Some embodiments of the present disclosure have been described in detail above. The description of the above embodiments merely aims to help to understand the present disclosure. Many modifications or equivalent substitutions with respect to the embodiments may occur to those of ordinary skill in the art based on the present disclosure. Thus, these modifications or equivalent substitutions shall fall within the scope of the present disclosure.

What is claimed is:

1. A display panel, having a display area, wherein in the display area the display panel comprises:
   a substrate;
   a first metal layer disposed on a side of the substrate, the first metal layer comprising a plurality of data lines arranged at intervals in a first direction;
   a metal oxide semiconductor layer disposed between the substrate and the first metal layer, the metal oxide semiconductor layer comprising a plurality of transparent active layers arranged in an array, the transparent active layers respectively comprising a plurality of first electrode conductor portions, an orthographic projection of each of the first electrode conductor portions on the substrate being between respective orthographic projections of two adjacent ones of the data lines on the substrate;
   a first transparent conductive layer disposed on a side of the first metal layer away from the metal oxide semiconductor layer, the first transparent conductive layer comprising a plurality of first transparent electrodes; and
   a second transparent conductive layer disposed on a side of the first transparent conductive layer away from the first metal layer and insulated from the first transparent conductive layer, the second transparent conductive layer comprising a plurality of second transparent electrodes,
   wherein two of the first electrode conductor portions respectively in any two adjacent ones of the transparent active layers in the first direction are electrically connected to one of the first transparent electrodes and one of the second transparent electrodes through via hole connections, respectively.

2. The display panel according to claim 1, wherein the first transparent conductive layer comprises a same material, has a same shape and has a same thickness as the second transparent conductive layer.

3. The display panel according to claim 2, wherein in the display area the display panel further comprises a pixel electrode layer comprising a plurality of first pixel electrodes and a plurality of second pixel electrodes;

each of the first pixel electrodes is electrically connected, through a third via hole, to one of the first transparent electrodes which is electrically connected to one of the first electrode conductor portions through a first via hole;

each of the second pixel electrodes is electrically connected, through a fourth via hole, to one of the second transparent electrodes which is electrically connected to one of the first electrode conductor portions through a second via hole;

in a direction perpendicular to the substrate, a sum of a depth of the first via hole and a depth of the third via hole is equal to a sum of a depth of the second via hole and a depth of the fourth via hole; and the pixel electrode layer comprises a same material as each of the first transparent conductive layer and the second transparent conductive layer.

4. The display panel according to claim 1, wherein in the display area the display panel further comprises:

a first insulating layer disposed between the first metal layer and the first transparent conductive layer; and a second insulating layer disposed between the first transparent conductive layer and the second transparent conductive layer, wherein the first transparent conductive layer is insulated from the second transparent conductive layer by the second insulating layer, and the first insulating layer comprises a same material as the second insulating layer.

5. The display panel according to claim 4, wherein a thickness of the second insulating layer is greater than a thickness of the first insulating layer.

6. The display panel according to claim 5, wherein each of the first transparent electrodes is adjacent to one second transparent electrode of the second transparent electrodes in the first direction;

a first orthographic projection of an edge of the each of the first transparent electrodes close to the one second transparent electrode on the substrate overlaps an orthographic projection of one of the data lines on the substrate; and a second orthographic projection of an edge of the one second transparent electrode close to the each of the first transparent electrodes on the substrate overlaps the orthographic projection of the one of the data lines on the substrate.

7. The display panel according to claim 6, wherein the first orthographic projection and the second orthographic projection adjoin or overlap each other.

8. The display panel according to claim 1, wherein the display area comprises a plurality of pixel regions arranged in an array, and in the display area the display panel comprises a plurality of thin film transistors arranged in an array and respectively corresponding to the pixel regions;

the plurality of thin film transistors comprise a plurality of first thin film transistors and a plurality of second thin film transistors which are alternately arranged in the first direction; and each of the first thin film transistors comprises one of the transparent active layers and one of the first transparent electrodes, and each of the second thin film transistors comprises one of the transparent active layers and one of the second transparent electrodes.

9. The display panel according to claim 8, wherein in the display area the display panel further comprises:

a first gate layer disposed between the substrate and the metal oxide semiconductor layer, the first gate layer comprising a plurality of first gate lines arranged at intervals in a second direction; and a second gate layer disposed between the metal oxide semiconductor layer and the first metal layer, the second gate layer comprising a plurality of second gate lines arranged at intervals in the second direction, wherein each of the plurality of thin film transistors further comprises a first gate, a second gate, and a second electrode, one of the first gate lines comprises the first gate, one of the second gate lines comprises the second gate, and one of the data lines comprises the second electrode.

10. The display panel according to claim 9, wherein the transparent active layers further respectively comprise a plurality of channels and respectively comprise a plurality of second electrode conductor portions;

in each of the transparent active layers, one of the first electrode conductor portions and one of the second electrode conductor portions are arranged respectively on opposite sides of one of the channels; and the second electrode is electrically connected to one of the second electrode conductor portions by a via hole connection.

11. A display device, comprising a housing and a display panel disposed in the housing, the display panel having a display area, wherein in the display area the display panel comprises:

a substrate;

a first metal layer disposed on a side of the substrate, the first metal layer comprising a plurality of data lines arranged at intervals in a first direction;

a metal oxide semiconductor layer disposed between the substrate and the first metal layer, the metal oxide semiconductor layer comprising a plurality of transparent active layers arranged in an array, the transparent active layers respectively comprising a plurality of first electrode conductor portions, an orthographic projection of each of the first electrode conductor portions on the substrate being between respective orthographic projections of two adjacent ones of the data lines on the substrate;

a first transparent conductive layer disposed on a side of the first metal layer away from the metal oxide semiconductor layer, the first transparent conductive layer comprising a plurality of first transparent electrodes; and a second transparent conductive layer disposed on a side of the first transparent conductive layer away from the first metal layer and insulated from the first transparent conductive layer, the second transparent conductive layer comprising a plurality of second transparent electrodes, wherein two of the first electrode conductor portions respectively in any two adjacent ones of the transparent active layers in the first direction are electrically connected to one of the first transparent electrodes and one of the second transparent electrodes through via hole connections, respectively;

the display area is divided into a plurality of pixel columns by the plurality of data lines, and each of the pixel columns comprises a plurality of pixel regions in each of which one of the transparent active layers is disposed;

the plurality of pixel columns comprise a plurality of odd-numbered pixel columns and a plurality of even-numbered pixel columns;

in each of the pixel regions of each of the odd-numbered pixel columns, one of the first electrode conductor portions is electrically connected to one of the first transparent electrodes; and in each of the pixel regions of each of the even-numbered pixel columns, one of the first electrode conductor portions is electrically connected to one of the second transparent electrodes.

12. The display device according to claim 11, wherein the first transparent conductive layer comprises a same material, has a same shape and has a same thickness as the second transparent conductive layer.

13. The display device according to claim 12, wherein in the display area the display panel further comprises a pixel electrode layer comprising a plurality of first pixel electrodes and a plurality of second pixel electrodes;

each of the first pixel electrodes is electrically connected, through a third via hole, to one of the first transparent electrodes which is electrically connected to one of the first electrode conductor portions through a first via hole;

each of the second pixel electrodes is electrically connected, through a fourth via hole, to one of the second transparent electrodes which is electrically connected to one of the first electrode conductor portions through a second via hole;

in a direction perpendicular to the substrate, a sum of a depth of the first via hole and a depth of the third via hole is equal to a sum of a depth of the second via hole and a depth of the fourth via hole; and the pixel electrode layer comprises a same material as each of the first transparent conductive layer and the second transparent conductive layer.

14. The display device according to claim 11, wherein in the display area the display panel further comprises:

a first insulating layer disposed between the first metal layer and the first transparent conductive layer; and a second insulating layer disposed between the first transparent conductive layer and the second transparent conductive layer, wherein the first transparent conductive layer is insulated from the second transparent conductive layer by the second insulating layer, and the first insulating layer comprises a same material as the second insulating layer.

15. The display device according to claim 14, wherein a thickness of the second insulating layer is greater than a thickness of the first insulating layer.

16. The display device according to claim 15, wherein each of the first transparent electrodes is adjacent to one second transparent electrode of the second transparent electrodes in the first direction;

a first orthographic projection of an edge of the each of the first transparent electrodes close to the one second transparent electrode on the substrate overlaps an orthographic projection of one of the data lines on the substrate; and a second orthographic projection of an edge of the one second transparent electrode close to the each of the first transparent electrodes on the substrate overlaps the orthographic projection of the one of the data lines on the substrate.

17. The display device according to claim 16, wherein the first orthographic projection and the second orthographic projection adjoin or overlap each other.

18. The display device according to claim 11, wherein in the display area the display panel comprises a plurality of thin film transistors arranged in an array, and in each of the pixel regions one of the thin film transistors is disposed;

the plurality of thin film transistors comprise a plurality of first thin film transistors and a plurality of second thin film transistors which are alternately arranged in the first direction; and each of the first thin film transistors comprises one of the transparent active layers and one of the first transparent electrodes, and each of the second thin film transistors comprises one of the transparent active layers and one of the second transparent electrodes.

19. The display device according to claim 18, wherein in the display area the display panel further comprises:

a first gate layer disposed between the substrate and the metal oxide semiconductor layer, the first gate layer comprising a plurality of first gate lines arranged at intervals in a second direction; and a second gate layer disposed between the metal oxide semiconductor layer and the first metal layer, the second gate layer comprising a plurality of second gate lines arranged at intervals in the second direction, wherein each of the plurality of thin film transistors further comprises a first gate, a second gate, and a second electrode, one of the first gate lines comprises the first gate, one of the second gate lines comprises the second gate, and one of the data lines comprises the second electrode.

20. The display device according to claim 19, wherein the transparent active layers further respectively comprise a plurality of channels and respectively comprise a plurality of second electrode conductor portions;

in each of the transparent active layers, one of the first electrode conductor portions and one of the second electrode conductor portions are arranged respectively on opposite sides of one of the channels; and the second electrode is electrically connected to one of the second electrode conductor portions by a via hole connection.

* * * * *